United States Patent [19]
McEwan

[11] Patent Number: 5,332,938
[45] Date of Patent: Jul. 26, 1994

[54] HIGH VOLTAGE MOSFET SWITCHING CIRCUIT

[75] Inventor: Thomas E. McEwan, Livermore, Calif.

[73] Assignee: Regents of the University of California, Oakland, Calif.

[21] Appl. No.: 863,914

[22] Filed: Apr. 6, 1992

[51] Int. Cl.$^5$ .................. H03K 17/687; H03K 17/56
[52] U.S. Cl. .................. 307/572; 307/542; 307/443
[58] Field of Search .............. 307/572, 491, 571, 570, 307/542, 443

[56] References Cited

U.S. PATENT DOCUMENTS

| | | | |
|---|---|---|---|
| 3,303,366 | 2/1967 | Kolling | 307/88.5 |
| 3,702,945 | 11/1972 | Faith et al. | 307/251 |
| 4,609,834 | 9/1986 | Gal | 307/443 |
| 4,683,387 | 7/1987 | Jones et al. | 307/571 |
| 4,740,717 | 4/1988 | Fletcher et al. | 307/443 |
| 4,794,274 | 12/1988 | Löhn | 307/253 |
| 4,812,686 | 3/1989 | Morse | 307/491 |
| 4,845,389 | 7/1989 | Pyndiah et al. | 307/529 |
| 4,862,018 | 8/1989 | Taylor et al. | 307/572 |
| 4,920,283 | 4/1990 | Elmer et al. | 307/443 |
| 4,988,902 | 1/1991 | Dingwall | 307/572 |
| 5,012,123 | 4/1991 | Ayasli et al. | 307/571 |

Primary Examiner—Timothy P. Callahan
Assistant Examiner—Toan Tran
Attorney, Agent, or Firm—Henry P. Sartorio

[57] ABSTRACT

The problem of source lead inductance in a MOSFET switching circuit is compensated for by adding an inductor to the gate circuit. The gate circuit inductor produces an inductive spike which counters the source lead inductive drop to produce a rectangular drive voltage waveform at the internal gate-source terminals of the MOSFET.

7 Claims, 1 Drawing Sheet ns on the order of 36A in 2
HIGH VOLTAGE MOSFET SWITCHING CIRCUIT The United States Government has rights in this invention pursuant to Contract No. W-7405-ENG-48 between the United States Department of Energy and the University of California for the operation of Lawrence Livermore National Laboratory.

BACKGROUND OF THE INVENTION

Field of the Invention

The present invention generally relates to MOSFET circuits and more particularly to fast switching in MOSFETs.

Fast switching in high voltage or high power semiconductors is desirable because a semiconductor switch dissipates the most power during switching, i.e., while it is in a state between fully "off" and fully "on". By minimizing switching time and, therefore, heating, the semiconductor can be allowed to switch more power. Fast switching is also needed in the formation of fast rising pulses for a variety of applications.

A primary limitation to fast switching in MOSFETs is source lead inductance. Heavy load currents combine with source lead inductance to form a large voltage drop in the source circuit, which subtracts directly from the gate drive. Since the source lead inductance is always deleterious, it should be minimized within the physical constraints of the MOSFET package or die bonds, but it cannot be made equal to zero.

SUMMARY OF THE INVENTION

Accordingly, it is an object of the invention to improve switching speeds in MOSFETs.

It is another object of the invention to compensate for source lead inductance in a MOSFET.

It is another object of the invention to utilize inexpensive MOSFETs in simple circuit topology.

The invention is method and apparatus for improving MOSFET switching speed. The invention counters the voltage drop present at the gate lead of a MOSFET by adding a compensating inductor in parallel to the gate lead. This voltage drop, caused by parasitic inductance at the source, is countered by the compensating inductor by applying an inductive voltage spike to the gate lead.

DETAILED DESCRIPTION OF THE PREFERRED EMBODIMENTS

Figure 1:
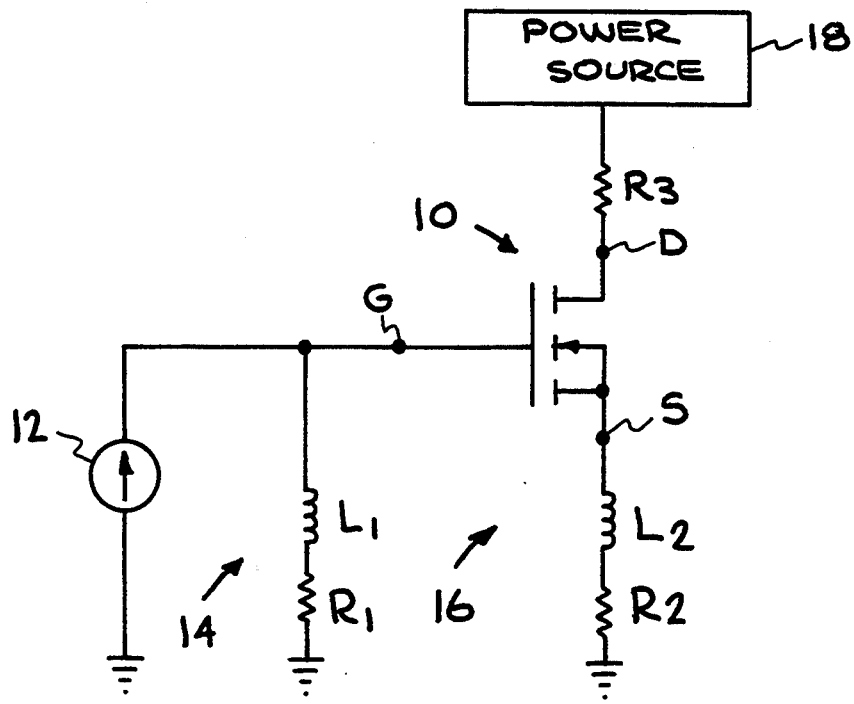
FIG. 1 is a schematic view of a MOSFET switching circuit according to the invention.

As shown in FIG. 1, the gate G of a MOSFET 10 is connected to a current source 12. In practice, the current source 12 is the drain of another MOSFET, or the collector of a bipolar transistor. The current source 12 is used to drive the gate circuit 14, which is connected in parallel to the gate G of MOSFET 10. The drive gate circuit 14 is made up of inductor L1 and resistor R1 in series.

The source S of the MOSFET 10 is similarly connected through a circuit 16 to ground. Source circuit 16 includes a resistor R2 and inductance L2. The inductance L2 is the lead or interconnect inductance of the MOSFET 10.

The drain D of MOSFET 10 is connected to a high voltage source 18 through a load represented by resistance R3. In operation, MOSFET 10 becomes conducting when a current drive is applied to the gate G, so the voltage at the drain D drops to zero, and the high voltage from source 18 is applied across the load R3.

In accordance with the invention, the inductance L1 placed in gate circuit 14 is used to compensate for the parasitic lead inductance L2 in the source circuit 16. The load current flowing through load R3 combines with inductance L2 to form a large voltage drop in the source circuit 16, which subtracts directly from the gate drive. By adding the gate circuit inductance L1, the source lead inductive drop is exactly countered with an inductive spike in the gate circuit. The net result is a rectangular drive voltage waveform at the internal gate-source terminals of the MOSFET 10.

For ideal compensation of inductance L2, the gate time constant $T_g$ and the source time constant $T_s$ are set to be equal: $T_s = T_g = R1 \times L1 = R2 \times L2$. The current gain, $G_i$, of the switch is: $G_i = $ Isource/Igate $= R1/R2 = L1/L2$.

Figure 2:
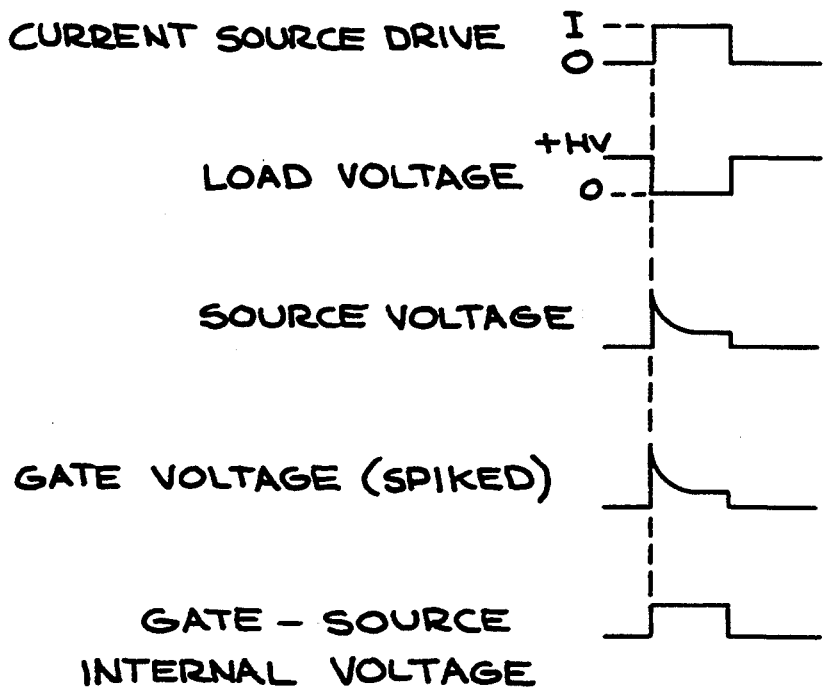
FIG. 2 is a diagram of the waveforms at various points in the MOSFET switching circuit of FIG. 1.

Illustrative waveforms for the circuit of FIG. 1 are shown in FIG. 2. A square wave current waveform is produced by current source 12. Because of the inductance L1 in gate circuit 14, the gate voltage at gate G, caused by the current from source 12, has an initial voltage spike. The voltage applied at gate G turns the MOSFET 10 on, allowing current to flow through load R3 and from drain D to source S of MOSFET 10 and through source circuit 16. The source voltage at source S has an initial spike caused by the parasitic lead inductance L2. Thus, the voltage waveforms at the gate G and source S compensate to produce a gate/source internal voltage waveform which is a desired square wave. The load voltage at the drain D of MOSFET 10 is also a uniform square wave.

For short pulse generation, R1 and R2 may be set to zero, i.e., totally omitted. This allows the source lead to be connected directly to ground to avoid incurring any additional inductance which may be associated with R2. The gate circuit is then made up entirely of inductor L1 connected to ground.

The invention has been used to generate 900 V, 36A pulses with a switching time on the order of 2 ns. Experimental data show that over 100 V of peak gate drive is needed to produce switching on the order of 36A in 2 ns. This voltage greatly exceeds the 40 V gate voltage rating of a typical MOSFET and would, thus, appear to be very destructive; however, most of the 100 V gate drive is dropped across the inductor L2, so the internal gate to source voltage never exceeds 20 V.

MOSFET's model no. 4N100 can be used to implement the invention. In a typical circuit gate resistance R1 has a value in the range 0–10Ω, source resistance R2 has a resistance in the range 0–1Ω, source lead inductance L2 has a value in the range 0.1–10 nH; thus, compensating gate inductance L1 has a value in the range 1–100 nH. In an illustrative embodiment, the values of the circuit components are $R_1 = 1\Omega$, $R_2 = 0.1\Omega$, $L_1 = 40$ nH, $L_2 = 4$ nH.

The advantage of the invention is that large, preshaped drive voltages may be applied to the MOSFET gate without danger of burnout. The benefits are unprecedented switching speeds, simplified drive circuitry, and the ability to use inexpensively packaged MOSFETs. The resultant pulses can be used to drive streak camera deflection plates and gated x-ray cameras, as well as many other applications.

Changes and modifications in the specifically described embodiments can be carried out without departing from the scope of the invention, which is intended to be limited only by the scope of the appended claims.

I claim:

1. A MOSFET switching circuit comprising:
    a MOSFET transistor having a drain D connected to a high voltage source through a load, a source S connected to ground through a source circuit including source lead inductance L2, and a gate G connected to a current source, wherein the source lead inductance L2 produces a source lead inductive drop;
    a gate circuit connected from the gate G to ground, the gate circuit including a compensating inductor L1 having a value selected to produce an inductive spike in the gate circuit to compensate for the source lead inductive drop;
    wherein the source circuit further includes a series resistance R2 in series with source lead inductance L2 and the gate circuit further includes a series resistance R1 in series with compensating inductor L1 and L1 = (R1/R2) L2.

2. The circuit of claim 1 wherein the high voltage source is greater than 100 V and switching currents flowing through the MOSFET transistor from drain D to source S are greater than 1A.

3. In a MOSFET switching circuit comprising a MOSFET transistor having a drain D connected to a high voltage source through a load, a source S connected to ground through a source circuit including source lead inductance L2 which produces a source lead inductive drop, a gate G connected to a current source, and a gate circuit connected from the gate G to ground, a method of increasing switching speed comprising providing a compensating inductor L1 in the gate circuit having a value selected to produce an inductive spike in the gate circuit to compensate for the source lead inductive drop, wherein the source circuit further includes a series resistance R2 in series with source lead inductance L2 and the gate circuit further includes a series resistance R1 in series with compensating inductor L1, and further comprising selecting L1=(R1/R2)L2.

4. The method of claim 3 for a high voltage source greater than 100 V and switching currents greater than 1A flowing through the MOSFET transistor from drain D to source S.

5. A MOSFET switching circuit comprising:
    a MOSFET transistor having a drain D connected to a high voltage source through a load, a source S connected to ground through a source circuit including source lead inductance L2, and a gate G connected to a current source, wherein the source lead inductance L2 produces a source lead inductive drop;
    a gate circuit connected from the gate G to ground, the gate circuit including a compensating inductor L1 having a value selected to produce an inductive spike in the gate circuit to compensate for the source lead inductive drop;
    wherein the source circuit further includes a series resistance R2 in series with source lead inductance L2 and the gate circuit further includes a series resistance R1 in series with compensating inductor L1; and
    wherein R1 is in the range 0-10Ω, R2 is in the range 0-1Ω, L2 in the range 0.1-10 nH, and L1 is in the range 1-100 nH.

6. The circuit of claim 5 wherein R1=1Ω, R2=0.1Ω, L1=40 nH, L2=4 nH.

7. The method of claim 3 wherein the MOSFET transistor with compensating inductor has a switching time on the order of 2 ns.

* * * * *